United States Patent
Yamamoto

(10) Patent No.: US 11,882,654 B2
(45) Date of Patent: Jan. 23, 2024

(54) WIRING BOARD, ELECTRONIC DEVICE PACKAGE, AND ELECTRONIC DEVICE

(71) Applicant: KYOCERA Corporation, Kyoto (JP)

(72) Inventor: Makoto Yamamoto, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 296 days.

(21) Appl. No.: 17/598,948

(22) PCT Filed: Mar. 30, 2020

(86) PCT No.: PCT/JP2020/014534
§ 371 (c)(1),
(2) Date: Sep. 28, 2021

(87) PCT Pub. No.: WO2020/203964
PCT Pub. Date: Oct. 8, 2020

(65) Prior Publication Data
US 2022/0192015 A1 Jun. 16, 2022

(30) Foreign Application Priority Data
Mar. 29, 2019 (JP) .................................. 2019-065377

(51) Int. Cl.
| H05K 1/09 | (2006.01) |
| H05K 1/03 | (2006.01) |
| H05K 1/11 | (2006.01) |
| H05K 1/14 | (2006.01) |
| H05K 5/00 | (2006.01) |
| H05K 5/04 | (2006.01) |

(52) U.S. Cl.
CPC ........... *H05K 1/092* (2013.01); *H05K 1/0306* (2013.01); *H05K 1/117* (2013.01); H05K 1/144 (2013.01); H05K 5/0004 (2013.01); *H05K 5/04* (2013.01)

(58) Field of Classification Search
CPC .............................. H05K 1/092; H05K 1/0306
See application file for complete search history.

(56) References Cited

U.S. PATENT DOCUMENTS

| 4,736,276 A * | 4/1988 | Ushifusa | C04B 35/18 |
| | | | 428/209 |
| 5,354,415 A * | 10/1994 | Fushii | C04B 37/026 |
| | | | 216/13 |
| 2014/0284088 A1* | 9/2014 | Nakamura | H05K 1/09 |
| | | | 174/257 |
| 2017/0358513 A1* | 12/2017 | Abe | H01L 23/49866 |

FOREIGN PATENT DOCUMENTS

| JP | 09-129782 A | 5/1997 |
| JP | 2003-068937 A | 3/2003 |
| JP | 2007-294795 A | 11/2007 |
| WO | 2018/155053 A1 | 8/2018 |

* cited by examiner

*Primary Examiner* — Sherman Ng
(74) *Attorney, Agent, or Firm* — Volpe Koenig

(57) ABSTRACT

Disclosed is a wiring board, including: an insulating substrate containing aluminum oxide; and a metallized layer that includes a metal phase containing a metal material and a first glass phase containing a glass component and that is disposed on the insulating substrate. At least one of the insulating substrate and the metallized layer further contains mullite. In the metallized layer, the metal phase continues in a three-dimensional network shape, and the first glass phase is embedded between the metal phase.

11 Claims, 3 Drawing Sheets

FIG.4

| | Example 1 | Example 2 | Example 3 | Example 4 | Example 5 |
|---|---|---|---|---|---|
| Metal Powder | Mo+Mn | Mo+Mn | Mo+Mn | Mo+Mn | Mo+Mn |
| Filler | None | Aluminum Oxide | Aluminum Oxide | Mullite | Mullite |
| Amount Added (vol%) | 0 | 11.5 | 23.0 | 11.5 | 23.0 |
| Evaluation | AA | BB | CC | AA | BB |
| Residual Ratio (%) | 15 | 25 | 35 | 23 | 39 |

| | Example 6 | Example 7 | Example 8 | Example 9 | Example 10 |
|---|---|---|---|---|---|
| Metal Powder | Mo | Mo | Mo | Mo | Mo |
| Filler | None | Aluminum Oxide | Aluminum Oxide | Mullite | Mullite |
| Amount Added (vol%) | 0 | 11.5 | 23.0 | 11.5 | 23.0 |
| Evaluation | AA | BB | CC | BB | CC |
| Residual Ratio (%) | 28 | 32 | 42 | 43 | 57 |

WIRING BOARD, ELECTRONIC DEVICE PACKAGE, AND ELECTRONIC DEVICE

TECHNICAL FIELD

The present invention relates to a wiring board, electronic device package, and electronic device.

BACKGROUND ART

A wiring board that has been known includes an insulating substrate made of an insulating material such as aluminum oxide and a metallized layer that is made of a metal material such as molybdenum and formed on the surface of the insulating material.

In a wiring board, in order to improve the joining strength between the insulating substrate and the metallized layer, at least one of a first surface of the insulating substrate in contact with the metallized layer and a second surface of the metallized layer in contact with the insulating substrate contains at least one of a manganese silicate phase and a magnesium silicate phase (e.g. see Patent Document 1).

CITATION LIST

Patent Documents

Patent Document 1: WO 2018/155053A

SUMMARY OF INVENTION

Technical Problem

A wiring board of the present disclosure includes:
an insulating substrate containing aluminum oxide; and
a metallized layer that includes a metal phase containing a metal material and a first glass phase containing a glass component and that is disposed on the insulating substrate.

Further, in the wiring board of the present disclosure, at least one of the insulating substrate and the metallized layer contains mullite.

Further, in the metallized layer, the metal phase continues in a three-dimensional network shape, and the first glass phase is embedded between the metal phase.

BRIEF DESCRIPTION OF DRAWINGS

FIG. 4 is a list of the manufacturing conditions and peeling test results of test samples according to examples of the embodiment in FIG. 1.

DESCRIPTION OF EMBODIMENTS

Figure 1:
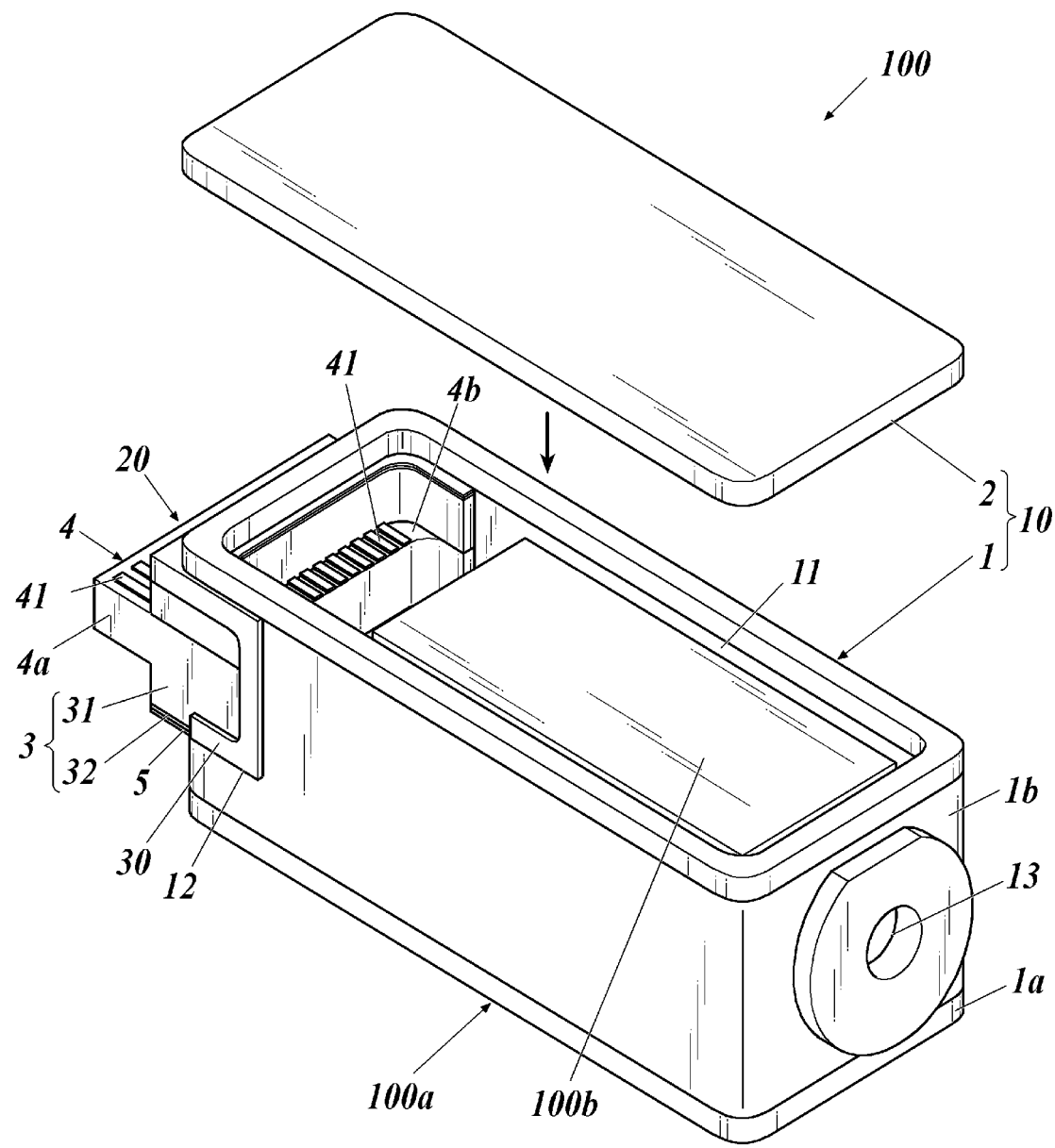
FIG. 1 is an exploded perspective view of an electronic device according to an embodiment of the present disclosure.

In recent years, further improvement in performance of wiring boards has been required. Specifically, it has been required to improve the joining strength between the insulating substrate and the metallized layer while maintaining the mechanical strength and the dielectric constant of the insulating substrate at the same level as the wiring board described in Patent Document 1.

In the wiring board, the electronic device package, and the electronic device of the present embodiment, the structure of the metallized layer 32 increases the joining strength between the insulating substrate and the metallized layer compared to a conventional art.

Hereinafter, embodiments of the present disclosure will be described in detail referring to the drawings.

However, the technical scope of the present disclosure is not limited by the examples illustrated in the following embodiments and drawings.

[Electronic Device]

Figure 2:
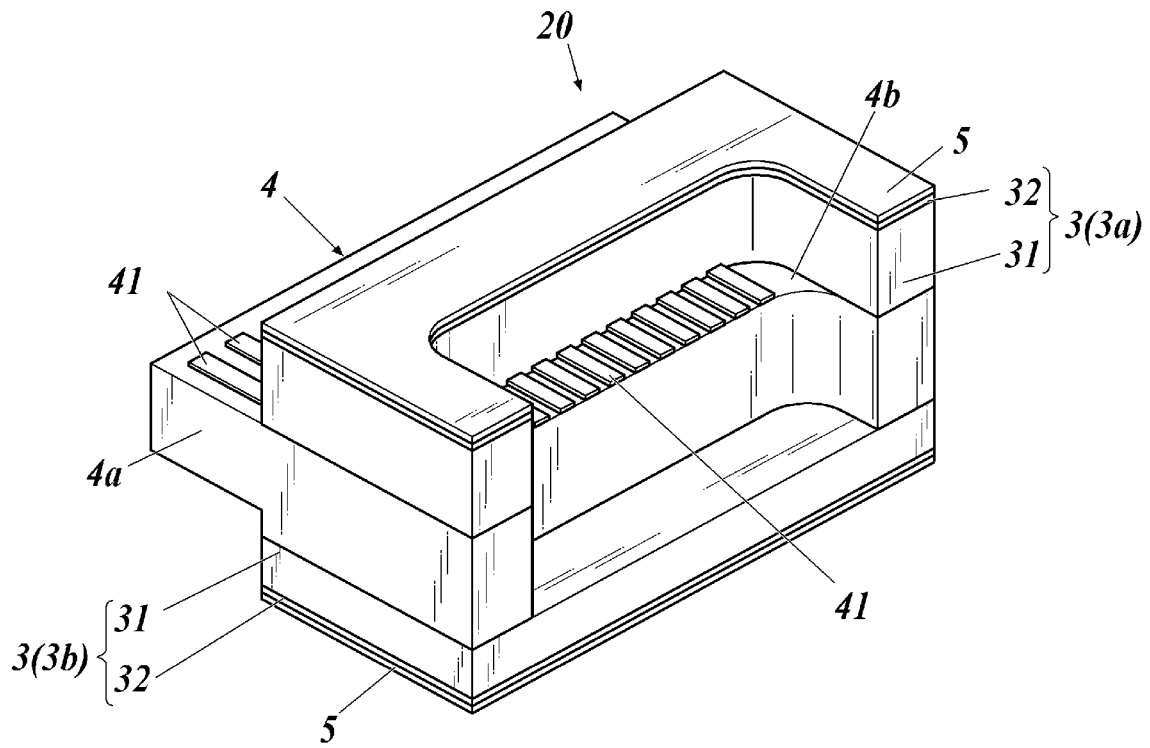
FIG. 2 is a perspective view of an input/output terminal of the electronic device in FIG. 1.

First, a schematic configuration of the electronic device 100 of the present embodiment will be described. FIG. 1 is an exploded perspective view of an electronic device 100, and FIG. 2 is a perspective view of an input/output terminal of the electronic device 100.

As illustrated in FIG. 1, the electronic device 100 of the present embodiment includes a package for an electronic device (hereinafter, package 100a) and an electronic component 100b.

The package 100a includes a housing 10 and an input/output terminal 20.

The housing 10 includes a main body 1 and a lid 2.

The main body 1 is made of a metal material and has a box shape with a recess 11.

Examples of the metal material include copper, copper alloys, iron/nickel alloys, iron/nickel/cobalt alloys, stainless steel and the like.

The main body 1 of the present embodiment has a bottom 1a and a frame 1b.

The bottom 1a is made of metal and has a rectangular plate shape in a plan view.

The frame 1b is made of metal and has a rectangular frame shape, and the plan view shape thereof is substantially the same as the outline of the bottom 1a. The lower surface of the frame 1b is joined to the peripheral portion of the upper surface of the bottom 1a. Accordingly, the space surrounded by the upper surface of the bottom 1a and the inner surfaces of the frame 1b corresponds to the recess 11.

The main body 1 may be configured such that the bottom 1a and the frame 1b are integrated in one piece (not composed of separate parts).

A fitting portion 12 is provided on one side wall of the main body 1.

When the input/output terminal 20 is not fitted in yet, the fitting portion 12 has an opening that penetrates the main body 1 (frame 1b). That is, the fitting portion 12 corresponds to the opening that penetrates from the recess 11 to the outside.

Further, a hole 13 is provided in the side wall of the main body 1 facing the one side wall.

An optical connection member (not shown) is provided in the hole 13. The optical connection member functions as an optical waveguide that optically connects the electronic component 100b and an optical device (not shown) disposed outside the housing 10.

The lid 2 is made of the same metal material as the main body 1 and has a rectangular plate shape. The plan view shape thereof is substantially the same as that of the bottom 1a. The peripheral portion of the lower surface of the lid 2 is joined to the upper surface of the frame 1b. Accordingly, the recess 11 of the main body 1 is closed, whereby the electronic component 100b described later is airtightly sealed.

The input/output terminal 20 is fitted in the fitting portion 12 of the housing 10 and is brazed to the housing 10 with a brazing material 30 (for example, AgCu).

As illustrated in FIG. 2, the input/output terminal 20 of the present embodiment includes a plurality of wiring boards 3, another wiring board 4, and plated layers 5.

More specifically, the input/output terminal 20 of the present embodiment includes two wiring boards 3 (3a, 3b). One wiring board 3a is located at the uppermost part of the input/output terminal 20, and the other wiring board 3b is located at the bottom of the input/output terminal 20.

Further, as illustrated in FIGS. 1 and 2, the upper surface of the wiring board 3a forming the uppermost portion and the lower surface of the wiring board 3b forming the lowermost portion are metallized layers 32.

The details of the wiring board 3 will be described later.

The other wiring board 4 forms a middle portion of the input/output terminal 20. That is, in the input/output terminal 20, the other wiring board 4 is located between the wiring board 3a forming the uppermost portion and the wiring board 3b forming the lowermost portion.

The other wiring board 4 has a pair of end portions, a first end portion 4a and a second end portion 4b, that is arranged in a direction connecting the outside of the housing 10 to the recess 11.

When the input/output terminal 20 is fitted in the housing 10, the first end portion 4a projects outward from the outer surface of the housing 10, and the second end portion 4b projects toward the recess 11 from the inner surface of the housing 10. That is, the first end portion 4a is located on the outer side of the housing 10, and the second end portion 4b is located on the inner side of the housing 10.

The upper surface portion of the other wiring board 4 includes the wiring 41.

The wiring 41 extends from the first end portion 4a to the second end portion 4b. Accordingly, the end of the wiring 41 on the first end 4a side is located at the recess 11 inside the housing 10, and the end on the second end 4b side is located outside the housing 10.

A plurality of wirings 41 may be provided.

The plated layers 5 of the present embodiment are provided on the upper surface of the wiring board 3a and the lower surface of the wiring board 3b.

As described above, the upper surface of the wiring board 3a and the lower surface of the wiring board 3b are metallized layers 32. That is, the plated layers 5 cover the surfaces of the metallized layers 32.

The brazing material 30 is sandwiched between the plated layers 5 and the housing 10.

Examples of the metal of the plated layers 5 include Ni.

As illustrated in FIG. 1, the electronic component 100b is housed in the recess 11 of the housing 10.

The electronic component 100b and the end of the wiring 41 on the second end 4b side are electrically connected to each other by a conductive connecting member (for example, a bonding wire) (not shown).

By connecting the end of the wiring 41 on the first end 4a side to another electronic component (not shown), the electronic component 100b and the other electronic component are electrically connected to each other.

[Wiring Boards]

Figure 3:
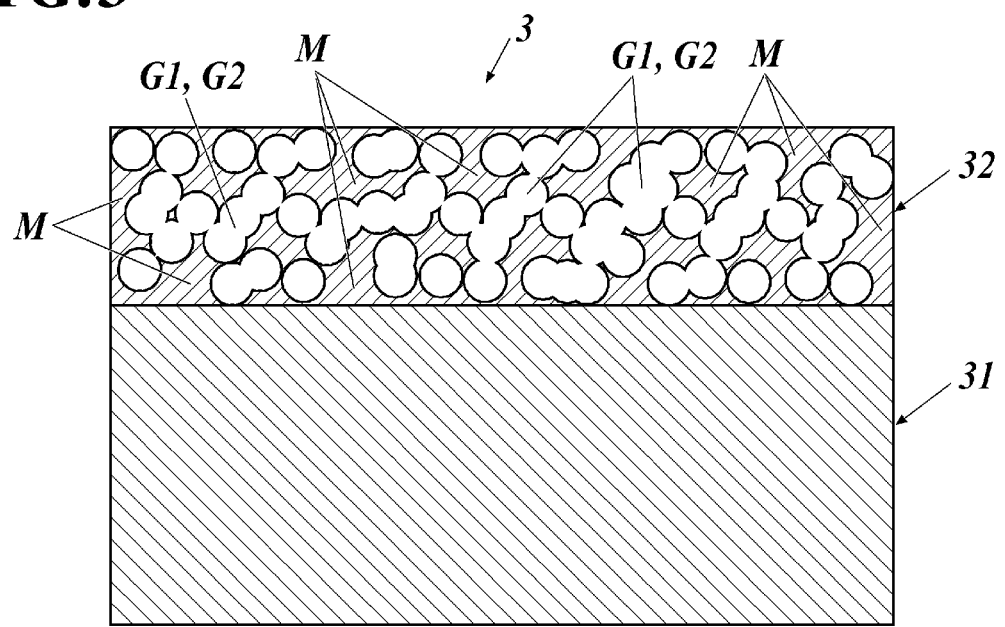
FIG. 3 is an enlargement of a cross section of the wiring board with the input/output terminal in FIG. 2.

Next, the specific configuration of the wiring boards 3 of in the input/output terminal 20 will be described. FIGS. 3 and 4 are enlargements of a cross section of each wiring board 3.

As illustrated in FIG. 3, each of the wiring boards 3 includes an insulating substrate 31 and a metallized layer 32.

The insulating substrate 31 of the present embodiment has a rectangular plate shape in a plan view.

Further, the insulating substrate 31 of the present embodiment contains aluminum oxide (alumina) and mullite. Specifically, the insulating substrate 31 of the present embodiment is composed of an aluminum oxide-based sintered body and a mullite-based sintered body.

Mullite has a lower relative permittivity than aluminum oxide. This allows the insulating substrate 31 of the present embodiment to reduce the signal transmission loss when a high frequency signal is transmitted through the metallized layer 32.

The insulating substrate 31 does not have to contain mullite when the metallized layer 32 (metal paste in the manufacturing stage) contains mullite.

In addition, mullite has lower mechanical strength than aluminum oxide. In general, the strength of the insulating substrate tends to decrease by the amount of mullite contained. However, in the insulating substrate 31 of the present embodiment, the crystals of aluminum oxide are fine. That is, the insulating substrate 31 is dense. Therefore, the insulating substrate 31 of the present embodiment can maintain the strength at the same level as the case where the mullite is not contained.

In the insulating substrate 31 of the present embodiment, the percentage of mullite to the whole insulating substrate 31 may be in the range of 30% to 80% by volume. In this range, the dielectric constant of the insulating substrate 31 is less than that of aluminum oxide (8 or less), and the bending strength of the insulating substrate 31 is equal to or greater than that of aluminum oxide (400 MPa or more).

The insulating substrate 31 may be constituted by a stack of multiple insulating layers. In this case, among the multiple insulating layers, at least the insulating layer in contact with the metallized layer 32 contains aluminum oxide and mullite. The other insulating layers does not have to contain, for example, mullite.

The metallized layer 32 covers the surface of the insulating substrate 31.

Further, the metallized layer 32 contains a metal material.

The metal material used in the present embodiment has a melting point that is higher than the temperature (1100° C. or higher) required for firing the insulating substrate 31.

Specific examples of the metal material include at least one of manganese, molybdenum, and tungsten.

The metal material may be a simple substance of such metals or a compound of at least one of such metals. Such compounds include oxides or silicates of the metals.

Further, when two or more metals are used as the metal material, the metal material may be an alloy.

In addition to the metal material, the metallized layer 32 may further contain a filler powder that contains at least one of aluminum oxide particles and mullite particles.

In particular, when the metallized layer 32 contains both aluminum oxide particles and mullite particles, the metallized layer 32 exhibits suitable electrical characteristics (dielectric constant) and bending strength.

When the insulating substrate 31 contains mullite, the metallized layer 32 does not have to contain mullite.

The metallized layer 32 further contains at least a glass component derived from mullite.

Further, in the metallized layer 32, the metal material forms a metal phase M.

The metallized layer 32 has an interpenetrating network structure composed of the metal phase M and a first glass phase G1 containing the glass component.

The "interpenetrating network structure" refers to a structure in which the metal phase M continues in a three-dimensional network shape and the first glass phase G1 is embedded between the metal phase M.

That is, the phases G1 and M are present in a mutually entangled state. In a certain cross section of the metallized layer 32, for example, as illustrated in FIG. 3, the metal phase M looks as if it is present as separate pieces in the first glass phase G1. In another cross section of the metallized layer 32, the metal phase M looks as if it is present as a single piece while the first glass phase G1 looks like as if it is present as separate pieces in the metal phase M.

The metal phase M is neither dispersed in the first glass phase G1 nor dissolved in the first glass phase G1.

Further, the first glass phase G1 is neither dispersed in the metal phase M nor dissolved in the metal phase M.

The interpenetrating network structure of the present embodiment exists over the entire metallized layer 32. That is, as illustrated in FIG. 3, the metal phase M and the first glass phase G1 entangled with each other are observed over the entire area in the direction along the interface between the insulating substrate 31 and the metallized layer 32 (the entire area in the surface direction). Further, the metal phase M and the first glass phase G1 entangled with each other is also observed over the entire area in the direction perpendicular to the interface between the insulating substrate 31 and the metallized layer 32 (the entire area in the thickness direction) (not shown). That is, when the surface portion of the metallized layer 32 on the side away from the insulating substrate 31 is cut in parallel with the boundary surface between the insulating substrate 31 and the metallized layer 32, the metal phase M and the first glass phase G1 entangled with each other are observed in the cross section. Further, when the boundary portion of the metallized layer 32 on the side close to the insulating substrate 31 is cut in parallel with the boundary surface, the metal phase M and the first glass phase G1 entangled with each other are also observed in the cross section.

The percentage of the metal phase at each boundary may be in the range of 60% to 70%, or may be about 50%.

Due to the interpenetrating network structure, the bond between the metal phase M and the first glass phase G1 in the metallized layer 32 is less likely to be broken. Therefore, the metallized layer 32 is less likely to peel off from the insulating substrate 31.

At least one of the interface between the metal phase M and the first glass phase G1 of the metallized layer 32 and the interface between the metal phase M and a second glass phase G2 of the insulating substrate of the present embodiment may have irregularities.

The irregularities are due to the broad particle size distribution of mullite contained in the insulating substrate 31, which will be described in detail later.

Since the irregularities produce an anchor effect at least between the metal phase M and the first glass phase G1 and/or between the metal phase M and the second glass phase G2, the metallize layer 32 is further less likely to peel off from the insulating substrate 31.

The above-described plated layer 5 is provided on the surface of the metallized layer 32. That is, the wiring board 3b, which forms the lowermost portion of the input/output terminal 20, includes the metallized layer 32 on the lower surface of the insulating substrate 31.

The above-described other wiring board 4 may be composed of an insulating substrate 31 as described above and a metallized layer 32 as described above that is formed in a wiring shape. In this case, the metallized layer 32 serves as the wiring 41 for electrically connecting the electronic component 100b to another electric circuit other than the electronic device 100.

A plated layer 5 may be provided on the surface of the metallized layer 32 that serves as the wiring 41.

[Manufacturing Method of Wiring Board]

Next, a method of manufacturing the wiring board 3 will be described.

The method of manufacturing the wiring board 3 of the present embodiment involves a blending step, a sheet preparing step, a first firing step, a paste preparing step, a coating step, and a second firing step.

In the first blending step, in order to stabilize the sintering properties of the insulating substrate 31, aluminum oxide and synthesized mullite are mixed and uniformly dispersed.

Further, in order to stabilize the shrinkage as well as the sintering properties, aluminum oxide and mullite are finely pulverized into powder while controlling the pulverized particle size.

Aluminum oxide is pulverized to an average particle size of about 1.5 µm.

Mullite has a lower hardness than aluminum oxide and is easily pulverized. Even if aluminum oxide and mullite as the starting materials have the same particle size, there is a difference in progress of pulverization between aluminum oxide and mullite. As a result, even if the mullite particles have an average particle size in the range of 1.5 to 2.0 µm, there would be many fine particles (average particle size <1.0 µm) that have a smaller particle size than the aluminum oxide particles. As a result, the particle size distribution of the mullite particles becomes broader than that of the aluminum oxide particles.

When a filler containing mullite particles is added to a metal paste in the paste preparing step described later, it is not necessary to pulverize the mullite in this step, and it is not necessary to add mullite to a ceramic green sheet in the following step.

After pulverizing aluminum oxide and mullite, the process proceeds to the sheet forming step. In this step, aluminum oxide powder and mullite powder are kneaded with an organic binder and an organic solvent to prepare a slurry.

At the time of kneading, at least one additive of silicon oxide (silica), manganese oxide, molybdenum oxide and magnesium oxide may be added to the slurry.

Then, a ceramic green sheet is prepared by molding the slurry into a sheet by a method such as a doctor blade method.

After forming the ceramic green sheet, the process proceeds to the first firing step. In this step, the ceramic green sheet is fired to prepare the insulating substrate 31.

The firing temperature may be in the range of 1300° C. to 1600° C.

In the first firing step, a laminate of multiple ceramic green sheets may be fired to prepare the insulating substrate 31 in which multiple insulating layers are laminated.

In this way, the ceramic green sheet becomes the insulating substrate 31.

As described above, mullite has lower mechanical strength than aluminum oxide. Accordingly, the strength of the insulating substrate 31 generally decreases by the amount of mullite contained. However, in the present embodiment, the aluminum oxide particles are fine particles having an average particle size of about 1.5 µm. Accordingly, aluminum oxide crystals formed in the sintering are also fine. Therefore, the insulating substrate 31 is dense, and the strength can be maintained at the same level as the case where the mullite is not contained.

In forming the ceramic green sheet, at least one additive of manganese, magnesium and silica may be added to the slurry. Then, the additive reduces the progress of crystallization of aluminum oxide and mullite. As a result, the insulating substrate 31 becomes denser and has improved mechanical strength.

After preparing the insulating substrate 31, the process proceeds to the paste preparing step. In this step, for example, a raw material powder containing molybdenum powder and manganese powder as main materials are kneaded with an appropriate organic solvent and a binder so that a metal paste is prepared. The materials are kneaded with a mill or the like.

In the present embodiment, a filler powder containing at least one of aluminum oxide particles and mullite particles is added to the metal paste at the time of kneading.

The same additive as that added to the ceramic green sheet (at least one of silicon oxide (silica), manganese oxide, molybdenum oxide, and magnesium oxide) may be added to the metal paste.

When mullite particles have been added to the insulating substrate 31, it is not necessary to add a filler powder containing mullite particles to the metal paste in this step.

The paste preparing step does not have to be implemented after the firing step, and may be implemented at any timing before the firing step is completed.

After preparing the insulating substrate 31, the process proceeds to the coating step. In this step, the metal paste prepared in the paste preparing step is applied to the surface of the insulating substrate 31 (any surface facing the thickness direction). The metal paste is applied by a method such as a screen printing method so that the thickness of the metallized layer 32 is achieved when fired.

After applying the metal paste to the insulating substrate 31, the process proceeds to the second firing step. In this step, the insulating substrate 31 coated with the metal paste is fired.

The firing temperature may be in the range of about 1100° C. to 1400° C.

During the firing, at least one of the mullite being metallized and the mullite of the insulating substrate 31 is decomposed, so that at least one of the first glass phase G1 and the second glass phase G2 (hereinafter, referred to as the first and second glass phases G1, G2) is eluted. Then, the first and second glass phases G1, G2 cover the surface of the aluminum oxide particles existing as nuclei in the metal paste. Further, the eluted first and second glass phases G1, G2 also cover the surface of remaining mullite particles that are not eluted. As a result, the ceramic components (aluminum oxide, mullite, first glass phase) in the metal paste are bonded and connected together, so that the interpenetrating network structure in which the first and second glass phases G1 and G2 are entangled with the metal phase M is formed.

When the filler powder added to the metal paste contains only aluminum oxide particles, the interpenetrating network structure is formed in the same manner.

In this way, the metal paste becomes the metallized layer 32, and the wiring board 3 of the present embodiment is prepared.

When the filler powder added to the metal paste contains only mullite particles, some of the mullite particles in the metal paste are not eluted and left. The eluted first glass phase G1 covers the surface of remaining mullite particles (that has not been eluted) existing as nuclei in the metal paste. Therefore, the interpenetrating network structure thus formed in the metallized layer 32 is relatively similar to the case where aluminum oxide particles are added.

When no filler is added to the metal paste (in this case, addition of mullite to the insulating substrate 31 is essential), the mullite in the insulating substrate 31 is eluted and penetrates into the gaps between the metal particles in the metal paste to fill the gaps. As a result, an interpenetrating network structure is formed to a certain degree.

The mullite particles in the insulating substrate 31 or the mullite particles in the metal paste are partially decomposed to form the first and second glass phases G1, G2. As described above, mullite particles have a broad particle size distribution. That is, in the insulating substrate 31, there are large particles and small particles of mullite. The mixed large and small mullite particles serve as nuclei, and the nuclei are covered with the eluted first and second glass phases G1, G2, so that irregularities are formed on the surfaces of the first and second glass phases G1, G2.

In this process, the gaps between the first and second glass phases G1, G2 and the first and second glass phases G1, G2 are filled with the metal phase M. As a result, irregularities are formed at at least one of the interface between the metal phase M and the first glass phase G1 of the metallized layer 32 and the interface between the metal phase M and the second glass phase G2 of the insulating substrate 31. The irregularities increase the joining strength between the insulating substrate 31 and the metallized layer 32.

When aluminum oxide particles are added to the metal paste, the aluminum oxide particles in the metal paste serve as nuclei to form an interpenetrating network structure even if mullite particles are not added to the metal paste (the second glass phase G2 is eluted from only the insulating substrate 31). This can increase the joining strength between the insulating substrate 31 and the metallized layer 32.

When the filler powder is added to the metal paste, the filler powder remains solid during firing. This maintains the viscosity of the first glass phase G1 in the metal paste at a predetermined level or higher. Accordingly, the first glass phase G1 is less flowable. As a result, the first glass phase G1 is more complicatedly entangled with the metal phase M.

In particular, when aluminum oxide particles are added as the filler powder, the metallized layer 32 can be easily plated later.

As the firing atmosphere in the second firing step, the dew point may be low.

Mullite decomposes in a reducing atmosphere. That is, the lower the dew point, the stronger the reducing property, and decomposition of mullite is promoted. Therefore, if the firing is performed in a firing atmosphere with a low dew point, an increased amount of glass components is eluted from mullite during the sintering. This can further increase the joining strength between the insulating substrate 31 and the metallized layer 32.

The method of manufacturing the wiring board 3 of the present embodiment involves the first firing step for preparing the insulating substrate 31 and the second firing step for forming the metallized layer 32. Instead, the firing for forming the insulating substrate and the firing for forming the metallized layer may be performed at the same time.

[Joining Strength of Wiring Board]

Next, the joining strength of the wiring board 3 will be described. FIG. 4 is a list of the manufacturing conditions and peel test results of test samples.

Prior to the description, the test samples (Examples 1 to 10) including different types of wiring boards 3 were prepared by the method of manufacturing the wiring board 3 according to the present disclosure.

Specifically, first, metal pastes having different compositions (molybdenum powder only or molybdenum powder plus manganese powder, presence/absence of filler powder (additive), percentage of filler powder (% by volume)) were prepared.

Then, different metal pastes were applied to the surface of each of the insulating substrates 31 that had been manufactured by the process involving the above-mentioned blending step through the first firing step.

The firing temperature of each insulating substrate 31 and each metal paste was 1350° C.

Thereafter, the surface of the metallized layer 32 of each of the wiring boards 3 thus manufactured was plated with Ni.

Thereafter, a brazing material was placed on the surface of the plated layer, a metal piece was further placed on the surface of the brazing material, and the metal piece was brazed.

The brazing temperature was 850° C. in each sample.

Next, a peel test was conducted for each sample.

Specifically, the metal piece of each sample was pulled and peeled off, and the surface of the wiring board 3 from which the metal piece had been peeled off was observed. Then, the observation results were evaluated based on the following evaluation criteria.

(Evaluation Criteria)

AA: There is a metallized layer remaining on a part of the surface.

BB: There is a lot of metallized layer remaining on the surface.

CC: There is further a lot of metallized layer remaining on the surface.

It should be noted that the sample evaluated as BB or CC has a higher joining strength as a product. The sample evaluated as AA also has a joining strength sufficient for use as a product.

Further, the residual ratio (%), which is the ratio of the area of the remaining metallized layer 32 to the area of the entire surface of the wiring board 3 from which the metal fittings have been peeled off, was calculated.

As a result of the test, the samples of Examples 1 and 6, in which the filler powder (aluminum oxide particles or mullite particles) was not added to the metal paste, were evaluated as AA. In contrast, the samples of Examples 2, 3, 5, 7 to 10, in which the filler powder was added to the metal paste, were evaluated as BB or CC.

The residual ratio of the metallized layer 32 in the samples of Examples 1 and 6 was 15% and 28%, respectively. In contrast, the residual ratio of the metallized layer 32 in the samples of Examples 2, 3, 5, 7 to 10 was 25%, 35%, 39%, 32%, 42%, 43%, and 57%, respectively.

That is, from the experimental results, it can be found that addition of the filler powder to the metal paste tends to improve the joining strength between the insulating substrate 31 and the metallized layer 32.

The samples of Examples 2, 4, 7, and 9, in which a relatively small amount of filler powder was added to the metal paste, were evaluated as BB, AA, BB, and BB respectively. In contrast, the samples of Examples 3, 5, 8 and 10, in which a relatively large amount of filler powder was added to the metal paste, were evaluated as CC, BB, CC, and CC, respectively.

Further, the residual ratio of the metallized layer 32 in the samples of Examples 2, 4, 7, and 9 was 25%, 23%, 32%, and 43%, respectively. In contrast, the residual ratio of the metallized layer 32 in the samples of Examples 3, 5, 8, and 10 was 35%, 39%, 42%, and 57%, respectively.

That is, from the experimental results, it can be found that the joining strength between the insulating substrate 31 and the metallized layer 32 tends to be improved when an increased amount of the filler powder is added to the metal paste.

The samples of Examples 4 and 5, in which mullite particles were used as the filler powder, were evaluated as AA and BB, respectively. In contrast, the samples of Examples 2 and 3, in which the same amount of aluminum oxide was used as the filler powder, were evaluated as BB and CC, respectively.

Further, the residual ratio of the metallized layer 32 in the samples of Examples 4 and 5 was 23% and 39%, respectively, whereas the residual ratio of the metallized layer 32 in the samples of Examples 2 and 3 was 25% and 35%, respectively.

That is, from the experimental results, it can be found that when the same amount of the filler powder is added, aluminum oxide particles tends to improve the joining strength between the insulating substrate 31 and the metallized layer 32 more than mullite particles.

It is presumed that this result is because the mullite is decomposed into glass and flows during firing so that the number of crystal nuclei is reduced.

The samples of Examples 4 and 5, which contained both molybdenum powder and manganese powder as metal powder, were evaluated as AA and BB, respectively. In contrast, the samples of Examples 9 and 10, which contained only molybdenum powder as the metal powder, were evaluated as BB and CC, respectively.

Further, the residual ratio of the metallized layer 32 in the samples of Examples 4 and 5 was 23% and 39%, respectively, whereas the residual ratio of the metallized layer 32 in the samples of Examples 9 and 10 was 43% and 57%, respectively.

That is, from the experimental results, it can be found that the joining strength between the insulating substrate 31 and the metallized layer 32 tends to be improved when the metal paste does not contain manganese powder.

It is presumed that this result is because manganese is partly eluted during firing to form manganese silicate crystals and flow.

In the wiring board 3 of the present embodiment described above, an interpenetrating network structure of the metal phase M and the first glass phase G1 is formed in the metallized layer 32. This makes it difficult for the metal phase M and the first glass phase G1 to be separated from each other in the metallized layer 32. As a result, in the wiring board 3 of the present embodiment, the joining strength between the insulating substrate 31 and the metallized layer 32 is increased compared to a conventional art.

When the electronic device 100 is continuously used, the housing 10 and the input/output terminal 20 become hot. In the electronic device 100, the housing 10 is made of metal, while most of the input/output terminal 20 is made of ceramic. There is a difference in thermal expansion between the housing 10 and the input/output terminal when the electronic device 100 gets hot. As a result, the housing 10 and the input/output terminal 20 are subjected to stress due to the difference in thermal expansion. The difference in thermal expansion is more remarkable in the wiring board to which mullite is added than in the wiring board formed only of aluminum oxide. That is, the wiring board of the present embodiment, to which mullite is added, is subjected to a greater stress than the wiring board formed only of aluminum oxide. However, the input/output terminal 20 of the package 100a of the present embodiment is brazed to the housing 10 via the metallized layer 32 that has high joining strength as described above. Therefore, in the electronic device 100, even if a large stress acts on the housing 10 and the input/output terminal 20, the joint portion between the housing 10 and the input/output terminal 20 is not easily damaged. As a result, the electronic device 100 is likely to maintain high reliability of electrical connection between the electronic component 100b and another external electronic component for a long period of time.

INDUSTRIAL APPLICABILITY

The present disclosure is applicable to wiring boards, electronic device packages, and electronic devices.

REFERENCE SIGNS LIST

100 Electronic device
100a Electronic device package
10 Housing
1 Main body
1a Bottom
1b Frame
11 Recess
12 Fitting portion
13 Hole
2 Lid
20 Input/output terminal
3 (3a, 3b) Wiring board
31 Insulating substrate
32 Metallized layer
G1 First glass phase
G2 Second glass phase
M Metal phase
4 Other wiring board
4a First end
4b Second end
41 Wiring
5 Plated layer
30 Brazing material
100b Electronic component

The invention claimed is:

1. A wiring board, comprising:
an insulating substrate containing aluminum oxide; and
a metallized layer that includes a metal phase containing a metal material and a first glass phase containing a glass component and that is disposed on the insulating substrate,
wherein at least one of the insulating substrate and the metallized layer further contains mullite, wherein the insulating substrate contains mullite particles that have a particle size less than a particle size of the aluminum oxide contained in the insulating substrate, and
wherein in the metallized layer,
the metal phase continues in a three-dimensional network shape, and the first glass phase is embedded between the metal phase.

2. The wiring board according to claim 1,
wherein the insulating substrate includes a second glass phase containing a glass component, and
wherein at least one of a first interface between the metal phase and the first glass phase and a second interface between the metal phase and the second glass phase has irregularities.

3. The wiring board according to claim 1,
wherein the insulating substrate has:
a dielectric constant that is less than a dielectric constant of aluminum oxide; and
a bending strength that is equal to or greater than a bending strength of aluminum oxide.

4. An electronic device package, comprising:
the wiring board according to claim 1; and
a housing that is made of metal and that has a recess and an opening penetrating from the recess to an outside,
wherein the insulating substrate is fitted in the opening.

5. An electronic device, comprising:
the electronic device package according to claim 4; and
an electronic device housed in the recess of the electronic device package.

6. The wiring board according to claim 2,
wherein the insulating substrate has:
a dielectric constant that is less than a dielectric constant of aluminum oxide; and
a bending strength that is equal to or greater than a bending strength of aluminum oxide.

7. The wiring board according to claim 1,
wherein the insulating substrate includes a laminated plurality of insulating layers, and
wherein of the plurality of insulating layers, at least an insulating layer in contact with the metallized layer contains mullite and aluminum oxide.

8. The wiring board according to claim 6, wherein a plurality of wirings is disposed on an upper surface of a second and subsequent insulating layer from a top of the plurality of insulating layers.

9. The wiring board according to claim 1, wherein a mean particle size of the aluminum oxide contained in the insulating substrate is equal to or less than a mean particle size of the mullite contained in the insulating substrate.

10. The wiring board according to claim 1, wherein the insulating substrate contains the mullite in an amount of 30% to 80% by volume.

11. The electronic device package according to claim 4,
wherein the insulating substrate includes a first end disposed outside the housing and a second end disposed inside the housing, and
wherein in a plan view, the second end includes a filleted corner.

* * * * *